United States Patent
Chang et al.

(10) Patent No.: US 10,037,917 B2
(45) Date of Patent: Jul. 31, 2018

(54) STRUCTURE AND FORMATION METHOD OF SEMICONDUCTOR DEVICE STRUCTURE

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/588,430

(22) Filed: May 5, 2017

(65) Prior Publication Data

US 2017/0236939 A1    Aug. 17, 2017

Related U.S. Application Data

(63) Continuation of application No. 14/930,231, filed on Nov. 2, 2015, now Pat. No. 9,673,331.

(51) Int. Cl.
| | |
|---|---|
| *H01L 21/8234* | (2006.01) |
| *H01L 21/311* | (2006.01) |
| *H01L 21/28* | (2006.01) |
| *H01L 21/321* | (2006.01) |
| *H01L 21/3105* | (2006.01) |
| *H01L 29/78* | (2006.01) |
| *H01L 29/06* | (2006.01) |

(Continued)

(52) U.S. Cl.
CPC ............ *H01L 21/823431* (2013.01); *H01L 21/28079* (2013.01); *H01L 21/28088* (2013.01); *H01L 21/31051* (2013.01); *H01L 21/31111* (2013.01); *H01L 21/32115* (2013.01); *H01L 27/0886* (2013.01); *H01L 29/0649* (2013.01); *H01L 29/4958* (2013.01); *H01L 29/4966* (2013.01); *H01L 29/517* (2013.01); *H01L 29/6681* (2013.01); *H01L 29/66545* (2013.01); *H01L 29/66795* (2013.01); *H01L 29/785* (2013.01); *H01L 29/7848* (2013.01); *H01L 29/7851* (2013.01)

(58) Field of Classification Search
CPC ......... H01L 29/66545; H01L 29/66795; H01L 29/785; H01L 29/7851; H01L 29/6681; H01L 21/823431; H01L 27/0886
See application file for complete search history.

(56) References Cited

U.S. PATENT DOCUMENTS 8,557,666 B2 * 10/2013 Wei ................ H01L 21/76224
                                                    257/E21.09
9,252,245 B1 *  2/2016 Akarvardar ....... H01L 29/66545
(Continued)

*Primary Examiner* — Marvin Payen
*Assistant Examiner* — Jeremy Joy
(74) *Attorney, Agent, or Firm* — Slater Matsil, LLP

(57) ABSTRACT

Structures and formation methods of a semiconductor device structure are provided. The semiconductor device structure includes a fin structure over a semiconductor substrate and a gate stack covering a portion of the fin structure. The gate stack includes a gate dielectric layer, a work function layer, and a conductive filling over the work function layer. The semiconductor device structure also includes a dielectric layer covering the fin structure. The dielectric layer is in direct contact with the conductive filling.

20 Claims, 8 Drawing Sheets

(51) Int. Cl.
  *H01L 29/66* (2006.01)
  *H01L 29/49* (2006.01)
  *H01L 29/51* (2006.01)
  *H01L 27/088* (2006.01)

(56) References Cited

U.S. PATENT DOCUMENTS

| | | | |
|---|---|---|---|
| 2005/0148137 A1* | 7/2005 | Brask | H01L 21/823821 438/216 |
| 2012/0018730 A1 | 1/2012 | Kanakasabapathy et al. | |
| 2013/0161762 A1* | 6/2013 | Kelly | H01L 29/66795 257/401 |
| 2013/0249003 A1* | 9/2013 | Oh | H01L 21/845 257/347 |
| 2013/0249019 A1* | 9/2013 | Kelly | H01L 29/7845 257/402 |
| 2013/0277686 A1* | 10/2013 | Liu | H01L 29/6653 257/77 |
| 2013/0299914 A1 | 11/2013 | Kim | |
| 2013/0302976 A1* | 11/2013 | Tsai | H01L 21/283 438/589 |
| 2014/0110784 A1* | 4/2014 | Jagannathan | H01L 29/78 257/347 |
| 2014/0203362 A1 | 7/2014 | Kim et al. | |
| 2014/0227847 A1* | 8/2014 | Yoon | H01L 29/66795 438/283 |
| 2014/0299939 A1* | 10/2014 | Kim | H01L 21/02697 257/369 |
| 2014/0312398 A1* | 10/2014 | Ching | H01L 29/66795 257/288 |
| 2014/0353719 A1* | 12/2014 | Kim | H01L 27/0886 257/192 |
| 2015/0132908 A1* | 5/2015 | Jeong | H01L 29/66545 438/283 |
| 2015/0171177 A1* | 6/2015 | Cheng | H01L 29/66795 257/288 |
| 2015/0206974 A1* | 7/2015 | Lim | H01L 29/7851 257/288 |
| 2015/0236131 A1 | 8/2015 | Chang et al. | |
| 2015/0262812 A1* | 9/2015 | Liu | H01L 21/0274 438/587 |
| 2015/0263132 A1* | 9/2015 | Liu | H01L 29/66545 438/303 |
| 2015/0263172 A1* | 9/2015 | Cho | H01L 29/0847 257/401 |
| 2015/0357468 A1* | 12/2015 | Zhu | H01L 29/66545 257/192 |
| 2015/0372112 A1* | 12/2015 | Chou | H01L 29/66545 257/392 |
| 2016/0093535 A1 | 3/2016 | Xu et al. | |

* cited by examiner

STRUCTURE AND FORMATION METHOD OF SEMICONDUCTOR DEVICE STRUCTURE

This application is a continuation application and claims the benefit of U.S. patent application Ser. No. 14/930,231, filed Nov. 2, 2015, entitled "Structure and formation method of semiconductor device structure," which application is hereby incorporated herein in its entirety.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
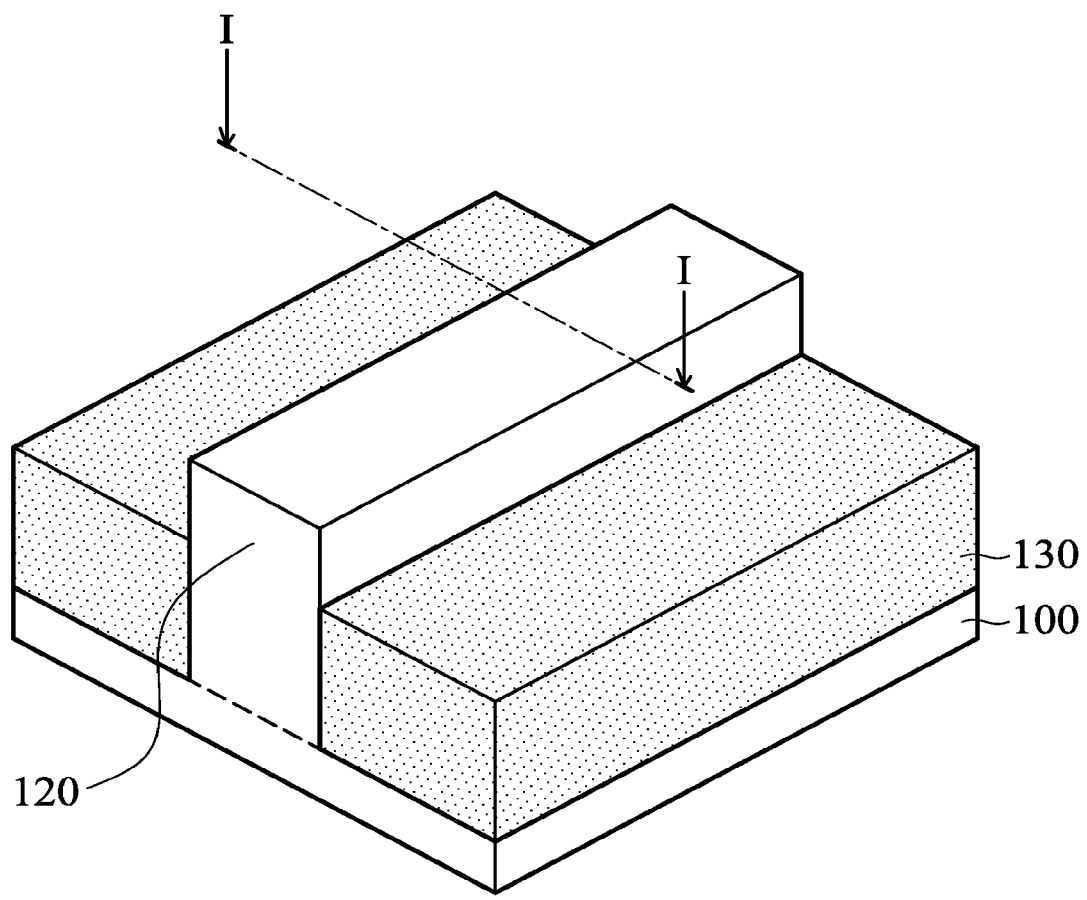
FIGS. 1A-1D are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1D are perspective views of various stages of a process for forming a semiconductor device structure, in accordance with some embodiments. FIGS. 2A-2F are cross-sectional views of various stages of a process for forming a semiconductor device structure, in accordance with some embodiments. In some embodiments, some of the cross-sectional views in FIGS. 2A-2F correspond to the cross-sectional views taken along the line I-I in FIGS. 1A-1D. Additional operations can be provided before, during, and/or after the stages described in FIGS. 1A-1D or FIGS. 2A-2F. Some of the stages that are described can be replaced or eliminated for different embodiments. Additional features can be added to the semiconductor device structure. Some of the features described below can be replaced or eliminated for different embodiments.

Figure 2A:
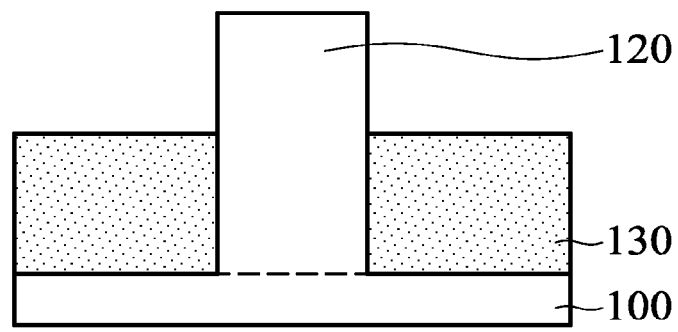
FIGS. 2A-2F are cross-sectional views of various stages of a process for forming a semiconductor device structure, in accordance with some embodiments.

As shown in FIGS. 1A and 2A, one or more fin structures including a fin structure 120 are formed over a semiconductor substrate 100, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, multiple recesses (or trenches) are formed in the semiconductor substrate 100. As a result, multiple fin structures including the fin structure 120 are formed between the recesses. For simplicity, only one of the fin structures (the fin structure 120) is shown. In some embodiments, one or more photolithography and etching processes are used to form the recesses.

As shown in FIGS. 1A and 2A, isolation features 130 are formed in the recesses to surround a lower portion of the fin structure 120, in accordance with some embodiments. In some embodiments, the isolation features 130 continuously surround the lower portion of the fin structures 102. In some embodiments, the isolation features 130 surround lower portions of other fin structures formed on the semiconductor substrate 100. The isolation features 130 are used to define and electrically isolate various device elements formed in and/or over the semiconductor substrate 100. In some embodiments, the isolation features 130 include shallow trench isolation (STI) features, local oxidation of silicon (LOCOS) features, other suitable isolation features, or a combination thereof.

In some embodiments, each of the isolation features 130 has a multi-layer structure. In some embodiments, the isolation features 130 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 130. The STI liner may also be used to reduce crystalline defects at the interface between the fin structures and the isolation features 130.

In some embodiments, a dielectric material layer is deposited over the semiconductor substrate 100. The dielectric material layer covers the fin structures including the fin structure 120 and fills the recesses between the fin structures. In some embodiments, a planarization process is performed to thin down the dielectric material layer. For example, the dielectric material layer is thinned until the fin structure 120 is exposed. The planarization process may include a chemical mechanical polishing (CMP) process, a grinding process, a dry polishing process, an etching process, another applicable process, or a combination thereof. Afterwards, the dielectric material layer is etched back to be below the top of the fin structure 120. As a result, the isolation features 130 are formed. The fin structures including the fin structure 120 protrude from top surfaces of the isolation features 130, as shown in FIGS. 1A and 2A in accordance with some embodiments.

Figure 1B:
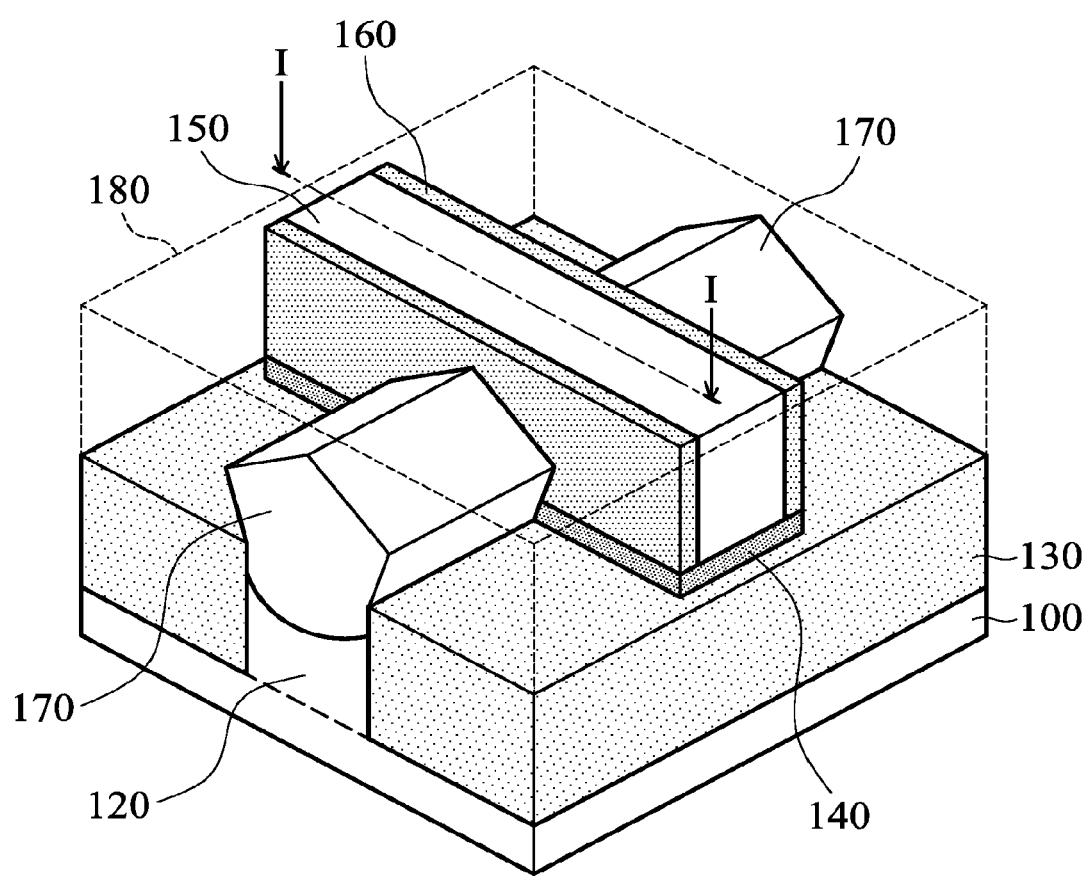
Figure 2B:
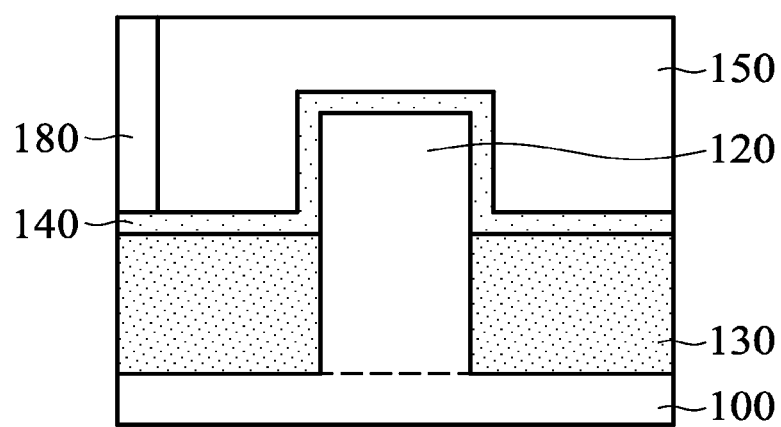

As shown in FIGS. 1B and 2B, a dummy gate stack including a gate dielectric layer 140 and a gate electrode 150 are formed over the fin structure 120 and the semiconductor substrate 100, in accordance with some embodiments. The dummy gate stack covers a portion of the fin structure 120. In some embodiments, the dummy gate stack covers portions of multiple fin structures including the fin structure 120.

In some embodiments, the gate dielectric layer 140 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 140 is a dummy gate dielectric layer which will subsequently be removed. In some other embodiments, the gate dielectric layer 140 is not formed.

In some embodiments, the gate dielectric layer 140 is deposited over the isolation features 103 and the fin structure 120 using a chemical vapor deposition (CVD) process, an atomic layer deposition (ALD) process, a thermal oxidation process, a physical vapor deposition (PVD) process, another applicable process, or a combination thereof.

Afterwards, the gate electrode 150 is formed over the gate dielectric layer 140 to cover a portion of the fin structure 120, as shown in FIGS. 1B and 2B in accordance with some embodiments. In some embodiments, the gate electrode 150 is a dummy gate electrode which will be replaced with a metal gate electrode. In some embodiments, the gate electrode 150 is made of polysilicon.

In some embodiments, a gate electrode layer is deposited over the gate dielectric layer 140. The gate electrode layer may be deposited using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer is used to pattern the gate electrode layer into one or more gate electrodes including the gate electrode 150. One or more etching processes may be used to etch the gate electrode layer through openings of the patterned hard mask layer so as to form the dummy gate stack.

Afterwards, spacer elements 160 are formed over sidewalls of the gate electrode 150, as shown in FIG. 1B in accordance with some embodiments. The spacer elements 160 may be used to assist in a subsequent formation of source/drain features. In some embodiments, the spacer elements 160 include one or more layers. In some embodiments, the spacer elements 160 are made of a dielectric material. The dielectric material may include silicon nitride, silicon oxide, silicon oxynitride, silicon carbide, another suitable material, or a combination thereof.

In some embodiments, a spacer material layer is deposited over the dummy gate stack using a CVD process, a PVD process, a spin-on process, another applicable process, or a combination thereof. Afterwards, the spacer material layer is partially removed using an etching process, such as an anisotropic etching process. As a result, remaining portions of the spacer material layer on the sidewalls of the dummy gate stack form the spacer elements 160, as shown in FIG. 1B. In some embodiments, the spacer elements 160 are formed after the portion of the gate dielectric layer 140 not covered by the gate electrode 150 is removed. In some embodiments, the gate dielectric layer 140 not covered by the gate electrode 150 is removed together with the spacer material layer during the etching process for forming the spacer elements 160.

Afterwards, source/drain features 170 are formed on the fin structure 120, as shown in FIG. 1B in accordance with some embodiments. In some embodiments, the fin structure 120 not covered by the gate electrode 150 and the spacer elements 160 is partially removed to form recesses using, for example, an etching process. Afterwards, source/drain features 170 are formed in the recesses. In some embodiments, the source/drain features 170 are epitaxially grown features formed using an epitaxial growth process. In some embodiments, the source/drain features 170 protrude from the recesses. In some embodiments, the source/drain features 170 are also used as stressors that can apply strain or stress on the channel region between the source/drain features 170. The carrier mobility may be improved accordingly.

As shown in FIGS. 1B and 2B, a dielectric layer 180 is then formed to surround the dummy gate stack and the source/drain features 170, in accordance with some embodiments. For a better understanding of the disclosure, the dielectric layer 180 in FIG. 1B is illustrated in dashed lines such that the elements covered by the dielectric layer 180 is visible. In some embodiments, a dielectric material layer is deposited to cover the source/drain features 170, the spacer elements 160, and the gate electrode 150.

In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, a planarization process may be used to partially remove the dielectric material layer. The dielectric material layer may be partially removed until the gate electrode 150 is exposed. As a result, the dielectric layer 180 is formed. In some embodiments, the planarization process includes a CMP process, a grinding process, a dry polishing process, an etching process, another applicable process, or a combination thereof.

Figure 1C:
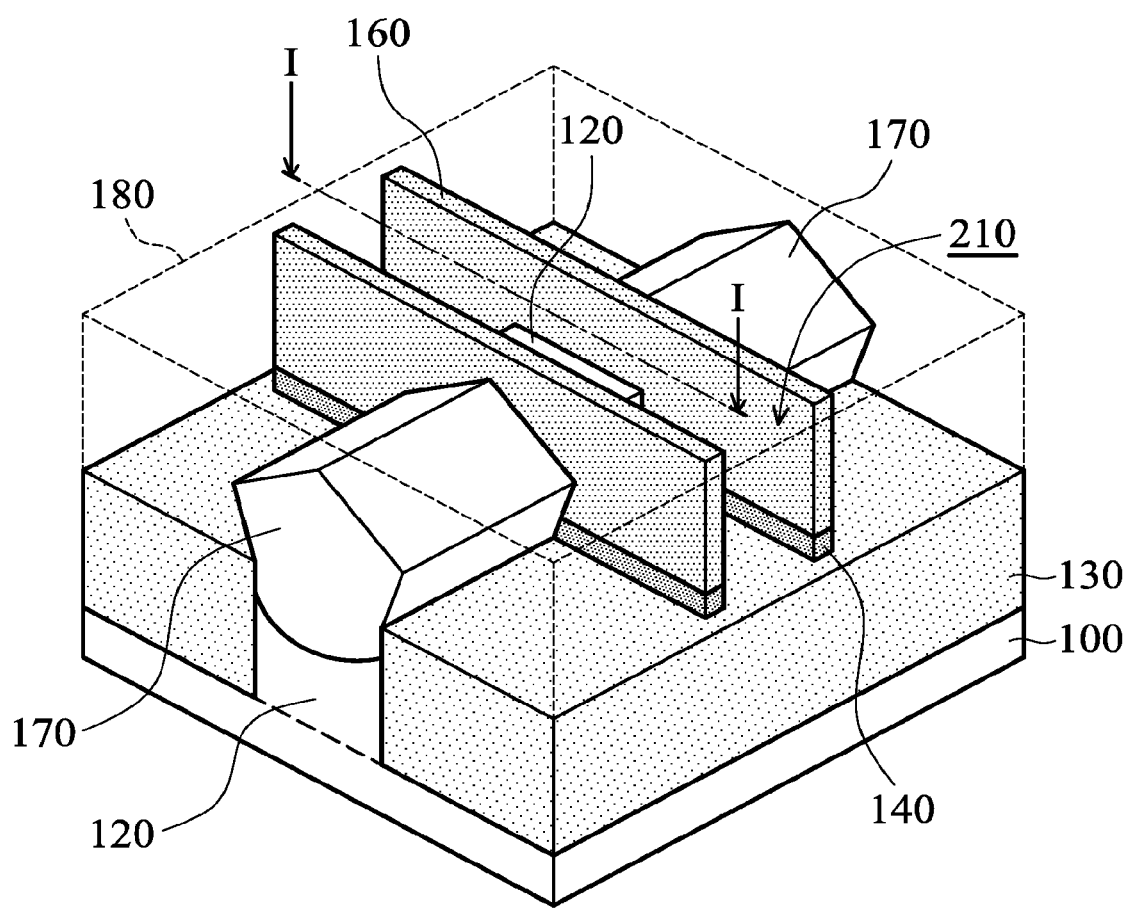
Figure 2C:
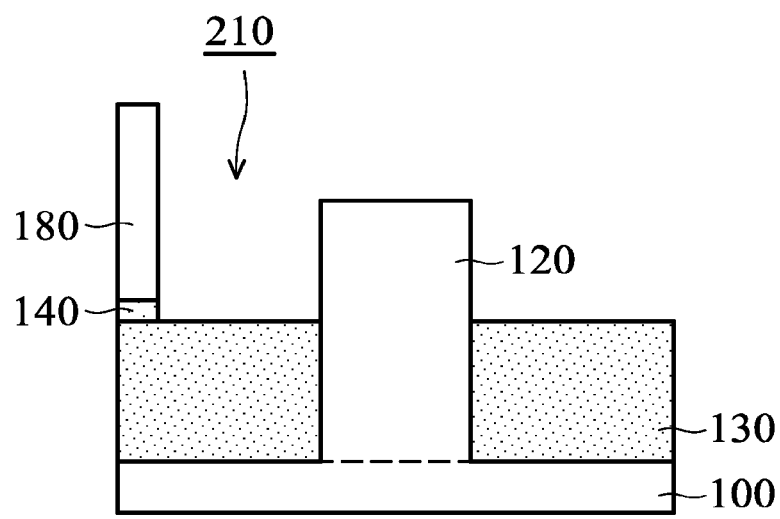

As shown in FIGS. 1C and 2C, the gate electrode 150 and the gate dielectric layer 140 are removed to form a recess 210, in accordance with some embodiments. The recess 210 is surrounded by the dielectric layer 180 and positioned between the spacer elements 160. The recess 210 exposes the fin structure 120. One or more etching processes may be used to form the recess 210. In some embodiments, a portion of the gate dielectric layer 140 directly under the spacer elements 160 remains without being removed.

Figure 2D:
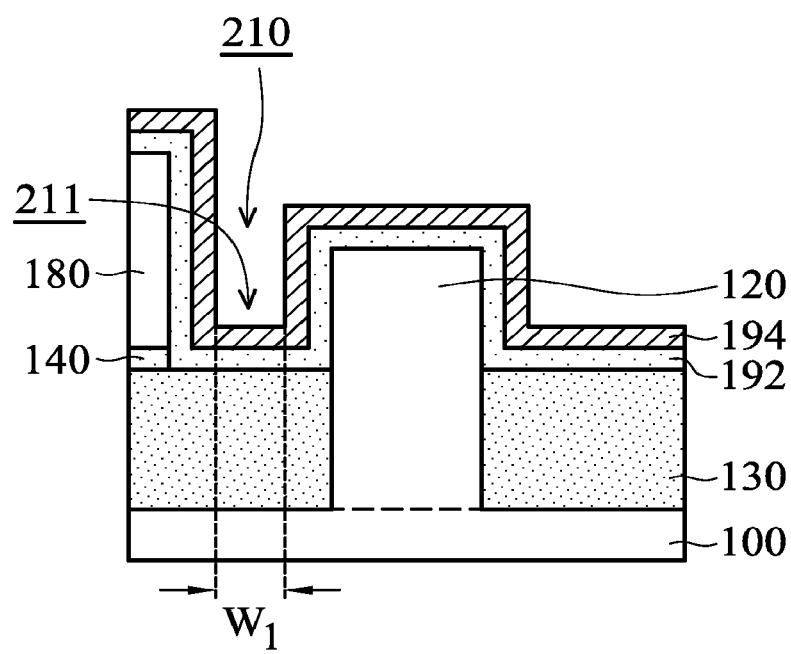

As shown in FIG. 2D, a gate dielectric layer 192 is deposited over the dielectric layer 180 and sidewalls and a bottom of the recess 210, in accordance with some embodiments. In some embodiments, the gate dielectric layer 192 is conformally covers the fin structure 120 and the sidewalls and bottom of the recess 210.

In some embodiments, the gate dielectric layer 192 and the gate dielectric layer 140 under the spacer elements 180 are made of different materials. In some embodiments, the gate dielectric layer 192 is made of a high-K dielectric material. The high-K dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 192 is deposited using an ALD process, a CVD process, another applicable process, or a combination thereof.

Afterwards, a work function layer 194 is deposited over the gate dielectric layer 192, as shown in FIG. 2D in accordance with some embodiments. In some embodiments, the work function layer 194 conformally covers the fin structure 120. The work function layer 194 is used to provide the desired work function for transistors to enhance device performance, such as improved threshold voltage. In some embodiments, the work function layer 194 is an n-type metal layer capable of providing a work function value suitable for the device, such as equal to or less than about 4.5 eV. In some embodiments, the work function layer 194 is a p-type metal layer capable of providing a work function value suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 194 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 194 may be fine-tuned to adjust the work function level. For example, a titanium nitride layer may be used as a p-type metal layer or an n-type metal layer, depending on the thickness and/or the compositions of the titanium nitride layer.

In some embodiments, the work function layer 194 is a stack of multiple sub-layers. In some embodiments, a barrier layer (not shown) is formed between the gate dielectric layer 192 and the work function layer 194. The barrier layer may be made of titanium nitride, tantalum nitride, another suitable material, or a combination thereof. In some embodiments, a blocking layer (not shown) is formed over the work function layer 194 before a subsequent formation of a conductive filling. The blocking layer may be made of tantalum nitride, titanium nitride, another suitable material, or a combination thereof. In some embodiments, the work function layer 194, the barrier layer, and the blocking layer are deposited using a CVD process, an electroplating process, a PVD process, an electroless plating process, another applicable process, or a combination thereof.

As shown in FIG. 2D, a portion of the recess 210 shrinks to form a gap 211 having a width $W_1$ after the formation of the gate dielectric layer 192 and the work function layer 194. In some embodiments, the width $W_1$ is small. As a result, a subsequent formation of a conductive filling may be difficult to perform. The conductive filling may not be able to completely fill the gap 211. The performance and reliability of the semiconductor device structure may be negatively affected.

Figure 2E:
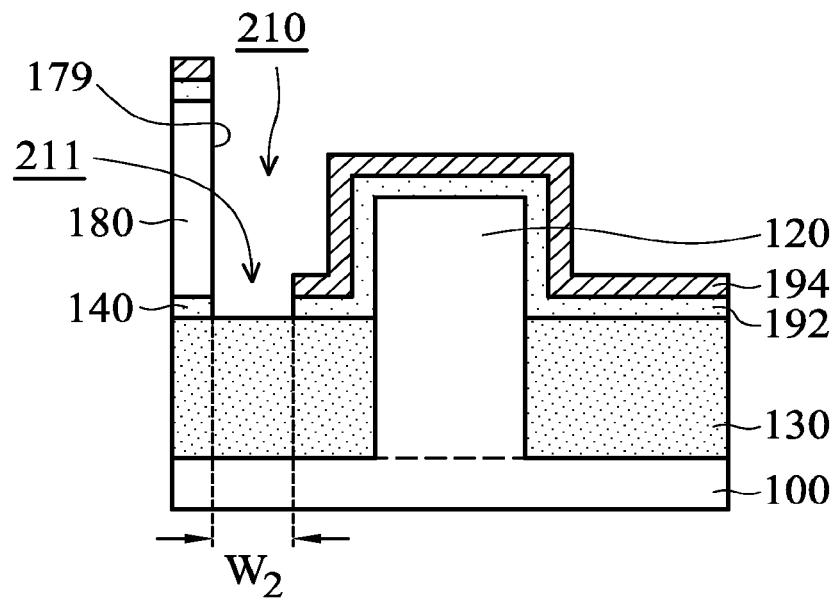

As shown in FIG. 2E, the gap 211 is enlarged to facilitate the subsequent formation of the conductive filling, in accordance with some embodiments. In some embodiments, a portion of the work function layer 194 on a sidewall 179 of the dielectric layer 180 is removed, as shown in FIG. 2E. Therefore, the gap 211 is enlarged. In some embodiments, a portion of the gate dielectric layer 192 on the sidewall 179 of the dielectric layer 180 is also removed, as shown in FIG. 2E. The gap 211 is further enlarged. As shown in FIG. 2E, the gap 211 is enlarged to have a width $W_2$ that is greater than the width $W_1$. In some embodiments, the width $W_2$ is in a range from about 0.5 nm to about 50 nm. In some embodiments, the sidewall 179 of the dielectric layer 180 is exposed after the partial removal of the work function layer 194 and the gate dielectric layer 192, as shown in FIG. 2E.

In some embodiments, a patterned mask layer (not shown) is formed over the structure shown in FIG. 2E. In some embodiments, the patterned mask layer is a patterned photoresist layer that has an opening exposing the portions of the work function layer 194 and the gate dielectric layer 192 on the sidewall 179 of the dielectric layer 180. Afterwards, one or more etching processes are used to partially remove the work function layer 194 and the gate dielectric layer 192. For example, a first etching process is used to remove the exposed portion of the work function layer 194. Afterwards, a second etching process is used to remove the exposed portion of the gate dielectric layer 192.

Figure 1D:
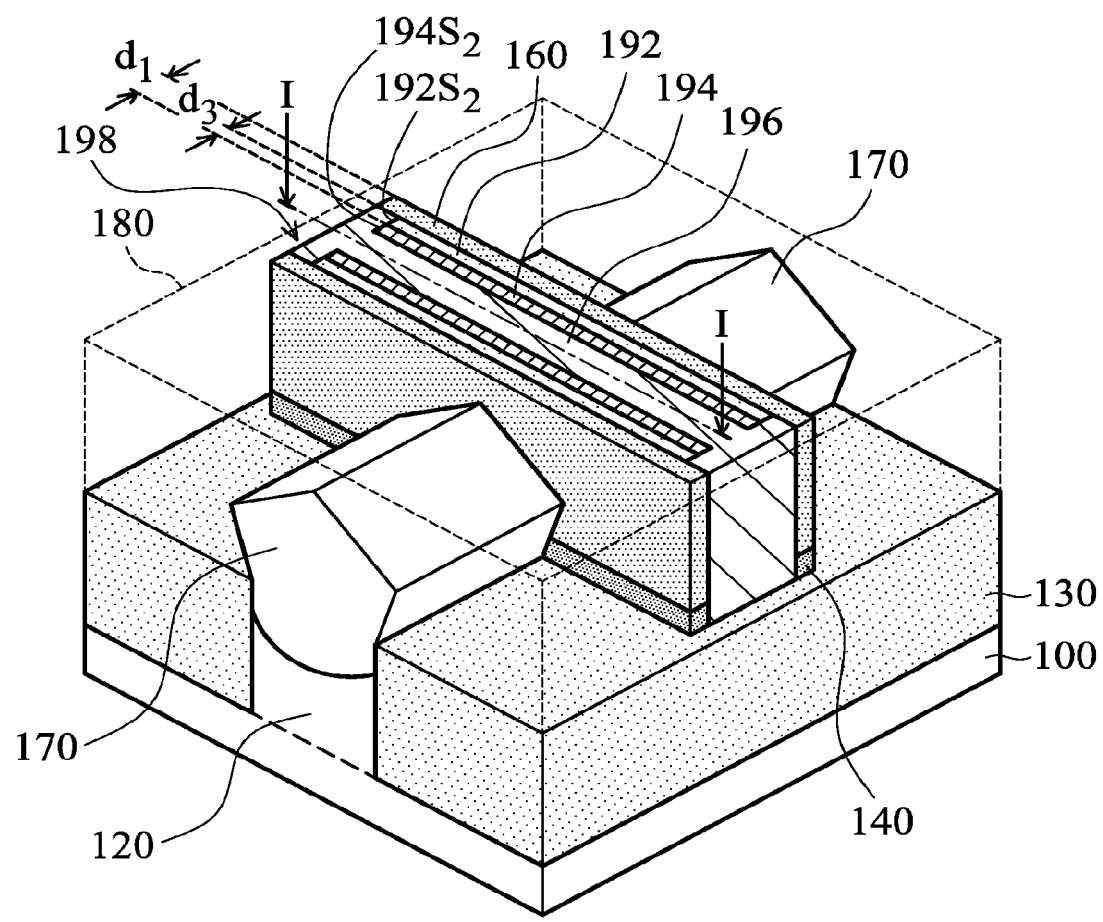
Figure 2F:
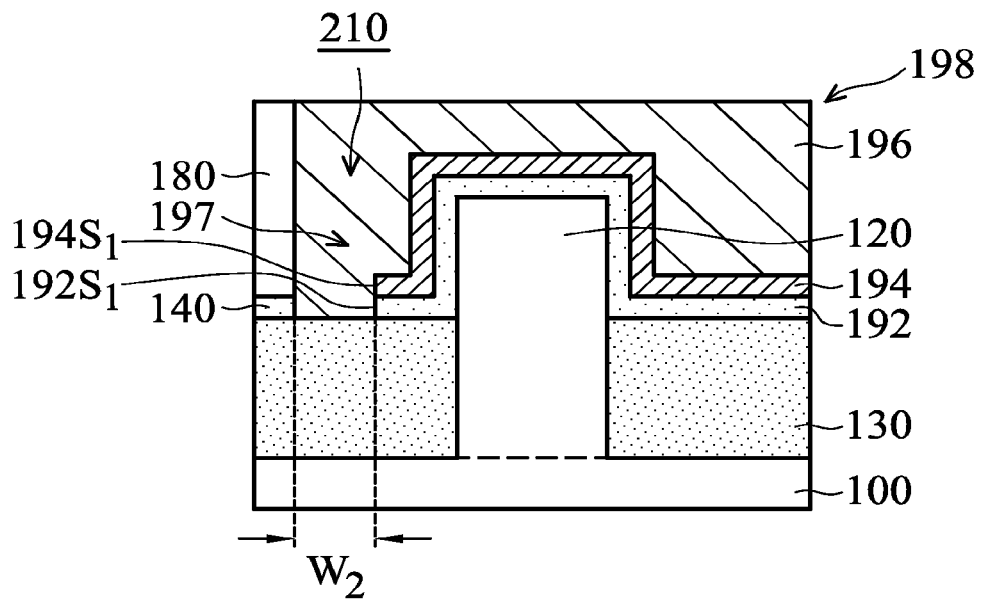

As shown in FIGS. 1D and 2F, a conductive filling 196 is deposited to fill the recess 210, in accordance with some embodiments. As a result, a gate stack 198 (or a metal gate stack), that includes the gate dielectric layer 192, the work function layer 194, and the conductive filling 196, is formed. In some embodiments, the conductive filling 196 is made of a metal material. The metal material may include tungsten, aluminum, copper, another suitable material, or a combination thereof.

In some embodiments, a conductive material layer is deposited over the dielectric layer 180 to fill the recess 210.

The conductive material layer may be deposited using a CVD process, an electroplating process, a PVD process, an electroless plating process, another applicable process, or a combination thereof. Since the gate dielectric layer 192 and the work function layer 194 on the sidewall 179 of the dielectric layer 180 is removed, the gap 211 becomes larger and easier to be completely filled with the conductive material layer. There is substantially no void formed in the conductive material layer filling the recess 210. The quality of the semiconductor device structure is therefore improved.

Afterwards, a planarization process is performed to remove the portions of the gate dielectric layer 192, the work function layer 194, and the conductive material layer outside of the recess 210. The remaining portion of the conductive material layer forms the conductive filling 196. As a result, the gate stack 198 is formed, as shown in FIGS. 1D and 2F. In some embodiments, the top surfaces of the dielectric layer 180, the conductive filling 196, the gate dielectric layer 192, and the work function layer 194 are substantially coplanar after the planarization process.

As shown in FIG. 1D, the spacer elements 160 are formed on the sidewall of the gate stack 198. In some embodiments, the spacer elements 160 are in direct contact with the gate dielectric layer 192. In some embodiments, the spacer elements 160 are in direct contact with the conductive filling 196. In some embodiments, the work function layer 194 is separated from the dielectric layer 180 by the conductive filling 196 and/or the spacer elements 160.

As shown in FIG. 2F, in some embodiments, the work function layer 194 and the gate dielectric layer 192 have side edges $194S_1$ and $192S_1$, respectively. In some embodiments, the side edges $194S_1$ and $192S_1$ are between the top and the bottom of the gate stack 198. In some embodiments, the conductive filling 196 covers the side edges $194S_1$ and/or $192S_1$. In some embodiments, the conductive filling 196 is in direct contact with the side edges $194S_1$ and/or $192S_1$. In some embodiments, the conductive filling 196 has a portion 197 that is positioned between the dielectric layer 180 and the work function layer 194, as shown in FIG. 2F.

As shown in FIG. 1D, the gate dielectric layer 192 has a side edge $192S_2$ at the top of the gate stack 198. The work function layer 194 has a side edge $194S_2$ at the top of the gate stack 198. In some embodiments, the conductive filling 196 covers the side edges $194S_2$ and/or $192S_2$. In some embodiments, the conductive filling 196 is in direct contact with the side edges $194S_2$ and/or $192S_2$.

As shown in FIGS. 1D and 2F, the conductive filling 196 and the spacer elements 160 together surround the work function layer 194 and the gate dielectric layer 192, in accordance with some embodiments. In some embodiments, the work function layer 194 and the gate dielectric layer 192 are not in direct contact with the dielectric layer 180 because of the conductive filling 196 and the spacer elements 160.

As shown in FIG. 1D, the dielectric layer 180 surrounds the gate stack 198. A distance $d_1$ is between the dielectric layer 180 and the work function layer 194. In some embodiments, the distance $d_1$ is the shortest distance between the dielectric layer 180 and the work function layer 194. In some embodiments, the distance $d_1$ is greater than a shortest distance between the dielectric layer 180 and the conductive filling 196. In the embodiments illustrated in FIG. 1D or 2F, the dielectric layer 180 is in direct contact with the conductive filling 196. The shortest distance between the dielectric layer 180 and the conductive filling 196 is equal to zero that is smaller than the shortest distance (such as the distance $d_1$) between the dielectric layer 180 and the work function layer 194.

As shown in FIG. 1D, a distance $d_3$ is between the work function layer 194 and one of the spacer elements 160. In some embodiments, the distance $d_3$ is the shortest distance between the work function layer 194 and one of the spacer elements 160. In some embodiments, the shortest distance (such as the distance $d_1$) between the dielectric layer 180 and the work function layer 194 is greater than the shortest distance (such as the distance $d_3$) between the work function layer 194 and one of the spacer elements 160.

Many variations and/or modifications can be made to embodiments of the disclosure. In the embodiments illustrated in FIGS. 1 and/or 2, the gate dielectric layer 192 and the work function layer 194 on the sidewall 179 of the dielectric layer 180 are completely removed to facilitate the formation of the conductive filling 196. However, embodiments of the disclosure are not limited thereto. In some other embodiments, the gate dielectric layer 192 and the work function layer 194 on the sidewall 179 of the dielectric layer 180 are completely removed but partially removed. The gap 211 is also enlarged after the gate dielectric layer 192 and the work function layer 194 on the sidewall 179 are partially removed. The formation of the conductive filling 196 still becomes easier.

Figure 3:
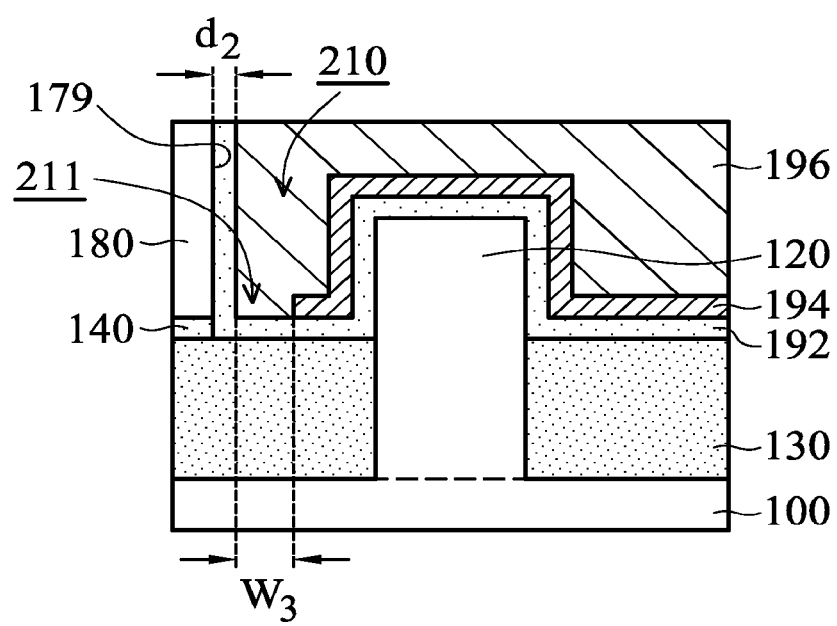
FIG. 3 is a cross-sectional view of a semiconductor device structure, in accordance with some embodiments.

FIG. 3 is a cross-sectional view of a semiconductor device structure, in accordance with some embodiments. In some embodiments, the work function layer 194 on the sidewall 179 of the dielectric layer 180 is removed. The gate dielectric layer 192 on the sidewall 179 is not removed or only partially removed. The gate dielectric layer 192 remains on the sidewall 179. In these cases, the gate dielectric layer 192 separates the conductive filling 196 from the dielectric layer 180. A distance $d_2$ is between the conductive filling 196 and the dielectric layer 180. In some embodiments, the distance $d_2$ is the shortest distance between the conductive filling 196 and the dielectric layer 180. In some embodiments, the shortest distance between the dielectric layer 180 and the conductive filling 196 (such as the distance $d_2$) is smaller than the shortest distance between the dielectric layer 180 and the work function layer 194.

Embodiments of the disclosure replace a dummy gate stack of a semiconductor device structure with a metal gate stack that includes a gate dielectric layer, a work function layer, and the conductive filling. A dielectric layer is formed to surround the dummy gate stack before it is replaced. Afterwards, the dummy gate is removed to form a recess in the dielectric layer. The gate dielectric layer and the work function layer are formed over sidewalls and a bottom of the recess. Portions of the work function layer and/or the gate dielectric layer are removed from a sidewall of the dielectric layer to enlarge a gap in the recess. Therefore, a subsequent formation of the conductive filling in the recess becomes easier to perform. The performance and reliability of the semiconductor device structure are significantly improved.

In accordance with some embodiments, a semiconductor device structure is provided. The semiconductor device structure includes a fin structure over a semiconductor substrate and a gate stack covering a portion of the fin structure. The gate stack includes a gate dielectric layer, a work function layer, and a conductive filling over the work function layer. The semiconductor device structure also includes a dielectric layer covering the fin structure. The dielectric layer is in direct contact with the conductive filling.

In accordance with some embodiments, a semiconductor device structure is provided. The semiconductor device structure includes a fin structure over a semiconductor substrate and a gate stack covering a portion of the fin structure. The gate stack includes a gate dielectric layer, a work function layer, and a conductive filling over the work function layer. The semiconductor device structure also includes a dielectric layer covering the fin structure and surrounding the gate stack. A shortest distance between the dielectric layer and the work function layer is greater than a shortest distance between the dielectric layer and the conductive filling.

In accordance with some embodiments, a method for forming a semiconductor device structure is provided. The method includes forming a dummy gate stack over a semiconductor substrate and forming a dielectric layer to surround the dummy gate stack. The method also includes removing the dummy gate stack to form a recess surrounded by the dielectric layer and forming a gate dielectric layer and a work function layer over sidewalls and a bottom of the recess. The method further includes removing a portion of the work function layer on a sidewall of the dielectric layer. In addition, the method includes forming a conductive filling to fill the recess after the portion of the work function layer on the sidewall of the dielectric layer is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a dummy gate stack over a fin structure, the fin structure being interposed between isolation regions;
   forming spacers along sidewalls of the dummy gate stack;
   forming a dielectric layer alongside the spacers, the spacers being interposed between the dielectric layer and the dummy gate stack;
   removing the dummy gate stack to form a recess, the fin structure being exposed in the recess;
   forming a gate dielectric layer over sidewalls and a bottom of the recess, the gate dielectric layer extending over the fin structure;
   forming a work function layer over the gate dielectric layer along the sidewalls and the bottom of the recess, the work function layer extending over the fin structure;
   removing a portion of the work function layer along the sidewalls of the recess, the gate dielectric layer on the sidewalls of the recess being free of the work function layer; and
   forming a conductive gate electrode in the recess, wherein the gate dielectric layer is interposed between the conductive gate electrode and the spacers, wherein a distance between the work function layer and a vertical portion of the gate dielectric layer is between about 0.5 nm and 50 nm.

2. The method of claim 1, wherein the conductive gate electrode extends to a bottom of the work function layer.

3. The method of claim 1, wherein the dummy gate stack comprises a dummy gate electrode overlying a dummy gate dielectric, wherein forming the spacers comprises forming the spacers over the dummy gate dielectric.

4. The method of claim 3, wherein after forming the conductive gate electrode, the spacers are separated from the isolation regions by the dummy gate dielectric.

5. The method of claim 4, wherein the dummy gate dielectric and the gate dielectric layer are formed of different materials.

6. The method of claim 1, wherein forming the spacers comprises forming the spacers directly on the isolation regions.

7. The method of claim 1, wherein the conductive gate electrode contacts the dielectric layer.

8. A method for forming a semiconductor device, the method comprising:
   forming a dummy gate stack over a fin structure, the fin structure being interposed between isolation regions;
   forming spacers along sidewalls of the dummy gate stack;
   forming a dielectric layer alongside the spacers, the spacers being interposed between the dielectric layer and the dummy gate stack;
   removing the dummy gate stack to form a recess, sidewalls of the spacers and the fin structure being exposed in the recess;
   forming a gate dielectric layer in the recess over sidewalls of the spacers and the fin structure, the gate dielectric layer contacting an entirety of a first sidewall of the dielectric layer, the first sidewall being substantially parallel to a longest sidewall of the fin structure;
   forming a work function layer over the gate dielectric layer;
   removing a portion of the work function layer along the sidewalls of the recess; and
   forming a conductive gate electrode in the recess, wherein a shortest distance between the spacers and the work function layer is greater than a shortest distance between the spacers and the conductive gate electrode along a same line.

9. The method of claim 8, wherein forming the dummy gate stack and forming the spacers comprises:
   forming a dummy gate dielectric;
   forming a dummy gate electrode over the dummy gate dielectric;
   forming a spacer layer over the dummy gate electrode;
   etching the spacer layer to form the spacers, wherein etching the spacer layer exposing portions of the dummy gate dielectric; and
   removing the portions of the dummy gate dielectric exposed by etching the spacer layer.

10. The method of claim 9, wherein after forming the conductive gate electrode, the spacers are separated from the isolation regions by remaining portions of the dummy gate dielectric.

11. The method of claim 10, wherein the dummy gate dielectric and the gate dielectric layer are formed of different materials.

12. The method of claim 8, wherein forming the dummy gate stack and forming the spacers comprises:
   forming a dummy gate dielectric;
   forming a dummy gate electrode over the dummy gate dielectric;
   removing exposed portions of the dummy gate dielectric; and
   after removing exposed portions of the dummy gate dielectric, forming the spacers alongside the dummy gate dielectric and the dummy gate electrode, wherein the spacers are directly over the isolation regions.

13. The method of claim 8, wherein the gate dielectric layer extends to an upper surface of the dielectric layer.

14. The method of claim 8, wherein the gate dielectric layer is only partially removed from a sidewall of the recess.

15. A semiconductor device structure, comprising:
a fin structure over a semiconductor substrate;
isolation regions on opposing sides of the fin structure;
a gate stack covering a portion of the fin structure, wherein the gate stack comprises a gate dielectric layer, a work function layer, and a conductive gate electrode over the work function layer;
a spacer along sidewalls of the gate stack, wherein the spacer is over the isolation regions;
a dummy gate dielectric interposed between the isolation regions and the spacer; and
a dielectric layer adjacent the spacer, the spacer being interposed between the dielectric layer and the gate stack, wherein a shortest distance along a line orthogonal to a lengthwise direction of the fin structure between the dielectric layer and the work function layer is greater than a shortest distance along the line orthogonal to the lengthwise direction of the fin structure between the spacer and the conductive gate electrode.

16. The semiconductor device structure of claim 15, further comprising an isolation regions adjacent the fin structure, wherein the work function layer terminates over the isolation region.

17. The semiconductor device structure of claim 15, wherein the conductive gate electrode is in direct contact with the gate dielectric layer.

18. The semiconductor device structure of claim 15, wherein an uppermost surface of the gate dielectric layer is level with an uppermost surface of the dielectric layer.

19. The semiconductor device structure of claim 15, wherein the conductive gate electrode directly contacts the dielectric layer.

20. The semiconductor device structure of claim 15, wherein the gate dielectric layer completely separates the conductive gate electrode from the dielectric layer.

* * * * *